United States Patent
Ke et al.

(10) Patent No.: US 9,941,002 B2
(45) Date of Patent: Apr. 10, 2018

(54) RESISTIVE MEMORY AND MEMORY CELL

(71) Applicant: Vanguard International Semiconductor Corporation, Hsinchu (TW)

(72) Inventors: Chih-Chuan Ke, New Taipei (TW); Yin-Ting Lin, Kaohsiung (TW); Yung-Chang Chen, Hsinchu (TW)

(73) Assignee: VANGUARD INTERNATIONAL SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 15/237,779

(22) Filed: Aug. 16, 2016

(65) Prior Publication Data

US 2018/0053549 A1    Feb. 22, 2018

(51) Int. Cl.
*G11C 11/00* (2006.01)
*G11C 13/00* (2006.01)

(52) U.S. Cl.
CPC ........ *G11C 13/004* (2013.01); *G11C 13/0069* (2013.01)

(58) Field of Classification Search
None
See application file for complete search history.

(56) References Cited

U.S. PATENT DOCUMENTS

| | | | |
|---|---|---|---|
| 7,126,841 B2 | 10/2006 | Rinerson et al. | |
| 7,633,788 B2 | 12/2009 | Choi et al. | |
| 8,649,203 B2 | 2/2014 | Chung | |
| 8,861,259 B2 | 10/2014 | Haukness | |
| 2013/0208530 A1* | 8/2013 | Oh | G11C 13/0002 365/148 |
| 2013/0250655 A1* | 9/2013 | Sugimae | G11C 13/0069 365/148 |
| 2016/0071582 A1* | 3/2016 | Chung | G11C 11/1675 365/96 |

FOREIGN PATENT DOCUMENTS

| | | |
|---|---|---|
| TW | 200816201 A | 4/2008 |
| TW | 201214441 A1 | 4/2012 |

* cited by examiner

*Primary Examiner* — Uyen B Tran
(74) *Attorney, Agent, or Firm* — Birch, Stewart, Kolasch & Birch, LLP

(57) ABSTRACT

A memory unit is provided. The memory unit includes a resistive element, a diode, and a first transistor. The resistive element has a first terminal receiving a bit voltage and a second terminal coupled to a first node. The diode has an anode coupled to the first node and a cathode coupled to a second node. The second node receives a word voltage. The first transistor has a control electrode, a first electrode coupled to the first node, and a second electrode.

12 Claims, 5 Drawing Sheets

RESISTIVE MEMORY AND MEMORY CELL

BACKGROUND OF THE INVENTION

Field of the Invention

The invention relates to a memory, and more particularly to a resistive memory.

Description of the Related Art

Recently, with the increased popularity of portable products, requirements such as low power usage and low supply voltage have become standard in the design indexes for portable products. These advantages help to extend the usage time of the portable products. Most portable products comprise memory units for storing data. However, for the memories which read data by using currents, low currents caused by low supply voltages cannot be used for these memories to correctly read the data stored therein. Thus, how to correctly read data stored in a memory at a low supply voltage is an important issue for memory design.

BRIEF SUMMARY OF THE INVENTION

An exemplary embodiment of a memory unit is provided. The memory unit comprises a resistive element, a diode, and a first transistor. The resistive element has a first terminal receiving a bit voltage and a second terminal coupled to a first node. The diode has an anode coupled to the first node and a cathode coupled to a second node. The second node receives a word voltage. The first transistor has a control electrode, a first electrode coupled to the first node, and a second electrode.

An exemplary embodiment of a resistive memory is provided. The resistive memory comprises a memory array and a sensing circuit. The memory array comprises a plurality of memory units. Each memory unit comprises a resistive element, a diode, and a first transistor. The resistive element has a first terminal receiving a bit voltage and a second terminal coupled to a first node. The diode has an anode coupled to the first node and a cathode coupled to a second node. The second node receives a word voltage. The first transistor has a control electrode, a first electrode coupled to the first node, and a second electrode. The sensing circuit is coupled to the memory array. When the resistive memory performs a read operation on a first memory unit among the plurality of memory units, the sensing circuit senses a current flowing through the first memory unit to obtain data stored in the first memory unit.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
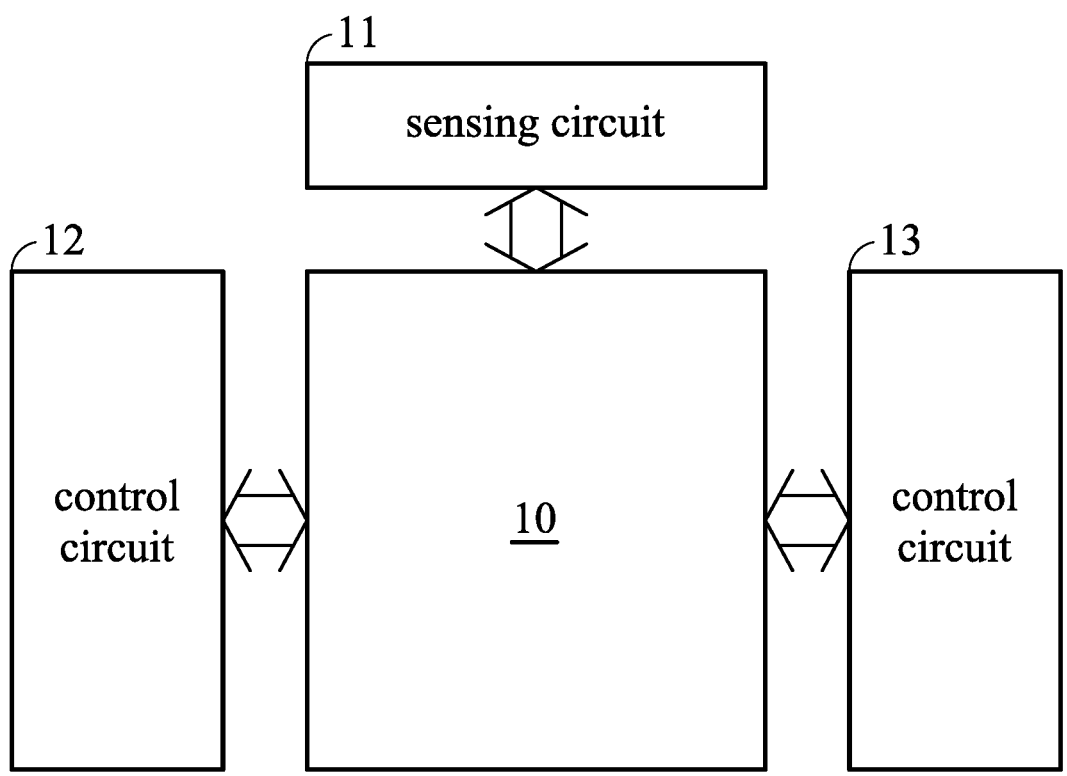
FIG. 1 shows an exemplary embodiment of a resistive memory.

FIG. 1 shows an exemplary embodiment of a resistive memory. In the embodiment of FIG. 1, the memory 1 is a resistive memory which operates at an operation voltage. The memory comprises a memory array 10, a sensing circuit 11, and control circuits 12 and 13. The memory array 10 comprises a plurality of resistive memory units. The memory 1 can perform a write or read operation on at least one memory unit through the operations of the sensing circuit 11 and the control circuits 12 and 13 for achieving data access. The control circuits 12 and 13 write data into the memory units by providing different voltages to them, and the sensing circuit 11 reads the data stored in the memory units by sensing the current within the memory units. In an embodiment, the control circuits 12 and 13 can be integrated into one single control circuit. The structure of the memory units and the write and read operations performed on the memory units will be described in the following paragraphs.

Figure 2:
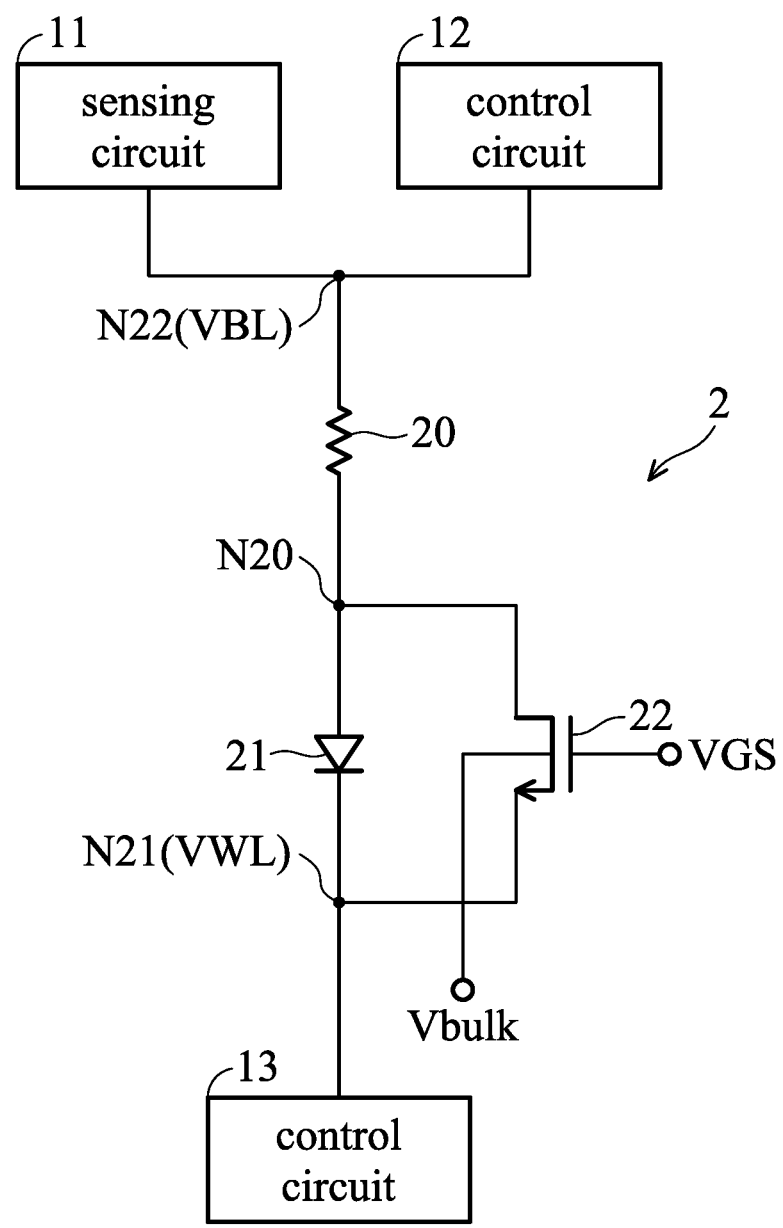
FIG. 2 shows one exemplary embodiment of a resistive memory unit.

FIG. 2 shows one exemplary embodiment of a memory unit. FIG. 2 shows the circuit structure of one memory unit. However, the other memory units of the memory array 1 have the same circuit structure. Moreover, in order to clearly describe the write and read operations performed on the memory units, FIG. 2 also shows the sensing circuit 11 and the control circuits 12 and 13. Referring to FIG. 2, the memory unit 2 comprises a resistive element 20, a diode 21, and an N-type metal oxide semiconductor (NMOS) 22. The resistive element 20 is implemented by a phase-change material. The first terminal of the resistive element 20 is coupled to a node N22, and the second terminal thereof is coupled to a node N20. The anode of the diode 21 is coupled to the node N20, and the cathode thereof is coupled to a node N21. The gate (control electrode) of the NMOS transistor 22 receives a control signal VGS, the drain (first electrode) thereof is coupled to the node N20, and the source (second electrode) thereof is coupled to the node N21. The bulk of the NMOS transistor 22 receives a bulk voltage Vbulk. The sensing 11 circuit and the control circuit 12 are coupled to the node N22, while the control circuit 13 is coupled to the node N21. The control circuit 12 provides a bit voltage VBL to the node N22. The control circuit 13 provides a word voltage VWL to the node N21.

When the memory 1 performs a write operation on the memory unit 2, the control circuit 12 provides a voltage at a high enough level according to the operation voltage of the memory 1 to serve as the bit voltage VBL, and the control circuit 13 provides a low-level voltage (such as 0V) to serve as the word voltage VWL. Meanwhile, the bulk voltage Vbulk is at a low level which is equal to or lower than 0V, and the NMOS transistor 22 is turned on according to the control signal VGS. Since the bit voltage VBL with the high enough level is applied to the memory 2, the resistance of the resistive element 20 changes, thereby writing data into the memory unit 2.

When the memory 1 performs a read operation on the memory unit 2, the control circuit 12 provides a voltage, which changes with the operation voltage and whose level is lower than the level of the operation voltage, to serve as the bit voltage VBL, and the control circuit 13 provide a low-level voltage (such as 0V) to serve as the word voltage VWL. Meanwhile, the bulk voltage Vbulk is at a low level which is equal to or lower than 0V, and the NMOS transistor 22 is turned on according to the control signal VGS. In cases where the operation voltage of the memory 1 is relatively high, the bit voltage VBL is at a high level in response to the operation voltage. At this time, based on the element characteristics of the diode 21, the diode 21 is turned on and has a large diode current due to the bit voltage VBL with the high level. Thus, the current flowing through the resistive element 21 is large enough for the sensing circuit 11 to obtain the resistance of the resistive element 20 through sensing the current following the resistive element 20, thereby obtaining the data which had been written into the memory unit 2. In the case where the operation voltage of the memory 1 is relatively low, the bit voltage VBL is at a low level in response to the operation voltage. At this time, even though the diode current of the diode 20 is less, the NMOS transistor 22 has an enough drain-source current due to the element characteristics of the NMOS transistor 22. Thus, at the low operation voltage, there is an enough current flowing through the resistive element 20. The sensing circuit 11 senses the current and obtains the resistance of the resistive element 22 according to the sensed current, thereby obtaining the data which had been written into the memory unit 2.

When no write or read operations are performed on the memory unit 2, the voltage, which is provided by the control circuit 13 to serve as the word voltage VWL, is at the same level as the bit voltage VBL present at that time, thereby avoiding a write error which is caused by generation of a current between the nodes N20 and N21.

According to the above embodiment, when the memory 1 operates at a low operation voltage, there is an enough current flowing through the resistive element 20 because the NMOS transistor 22 provides an extra current path, so that the sensing circuit 11 can also read data stored in the memory unit correctly.

Figure 3:
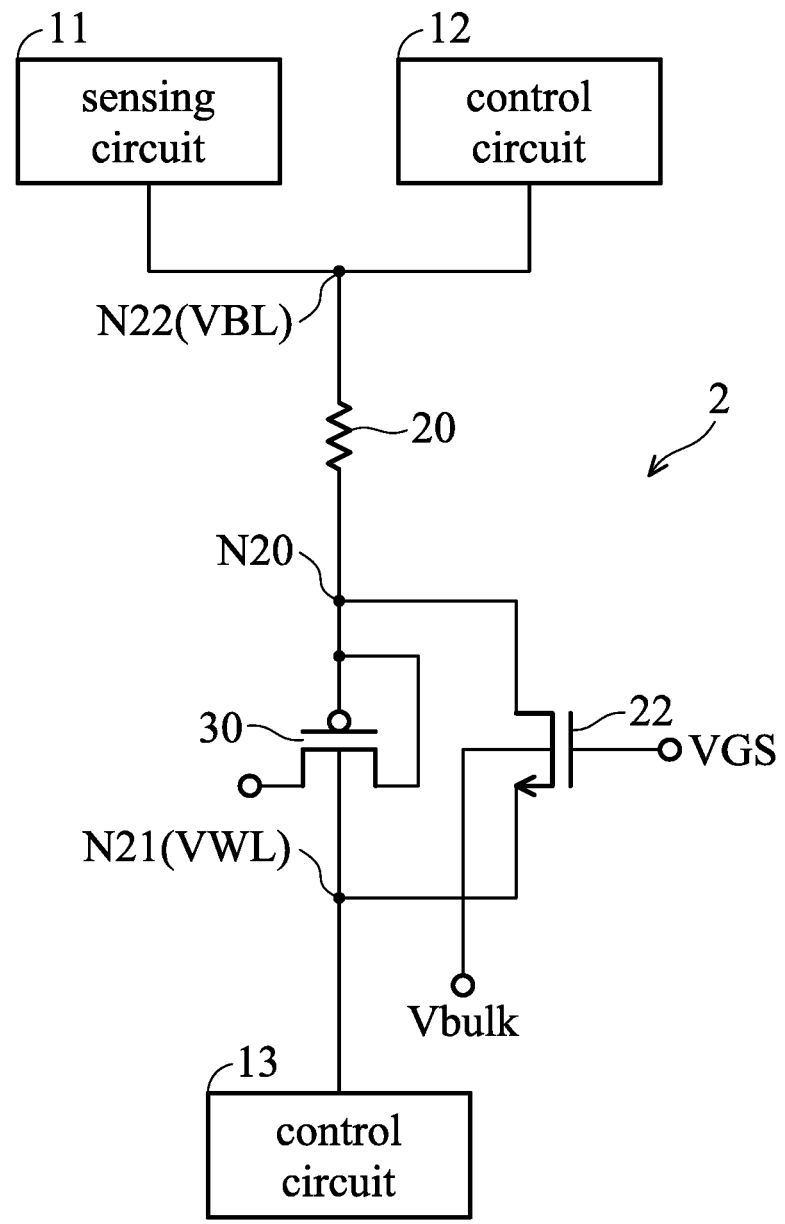
FIG. 3 shows another exemplary embodiment of a resistive memory unit.

In another embodiment, the diode 21 can be implemented by a P-type metal oxide semiconductor (PMOS) transistor. Referring to FIG. 3, both the gate (control electrode) and the drain (first electrode) of the PMOS transistor 30 are coupled to the node N20, and the source (second electrode) thereof is floating. The bulk of the PMOS transistor 30 is coupled to the node N21.

Figure 4:
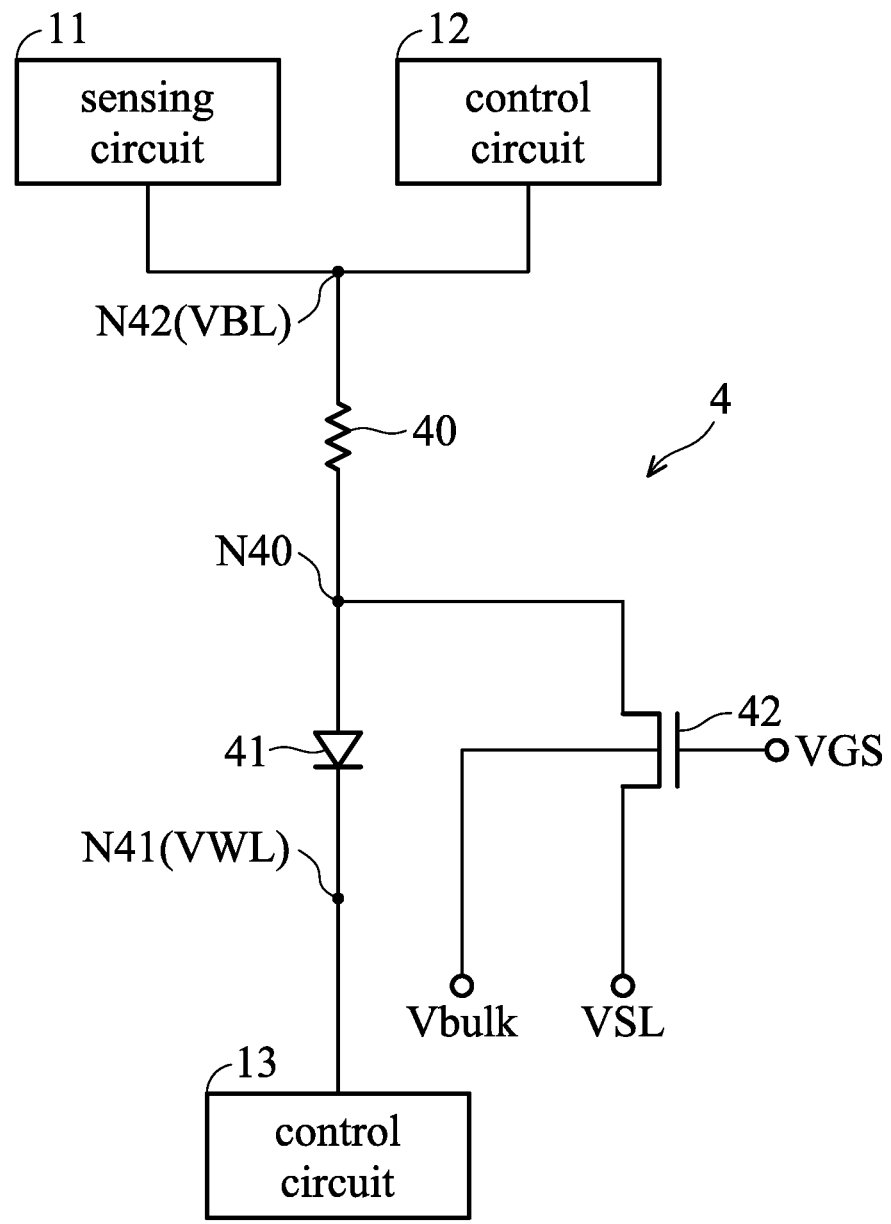
FIG. 4 shows another exemplary embodiment of a resistive memory unit.
Figure 5:
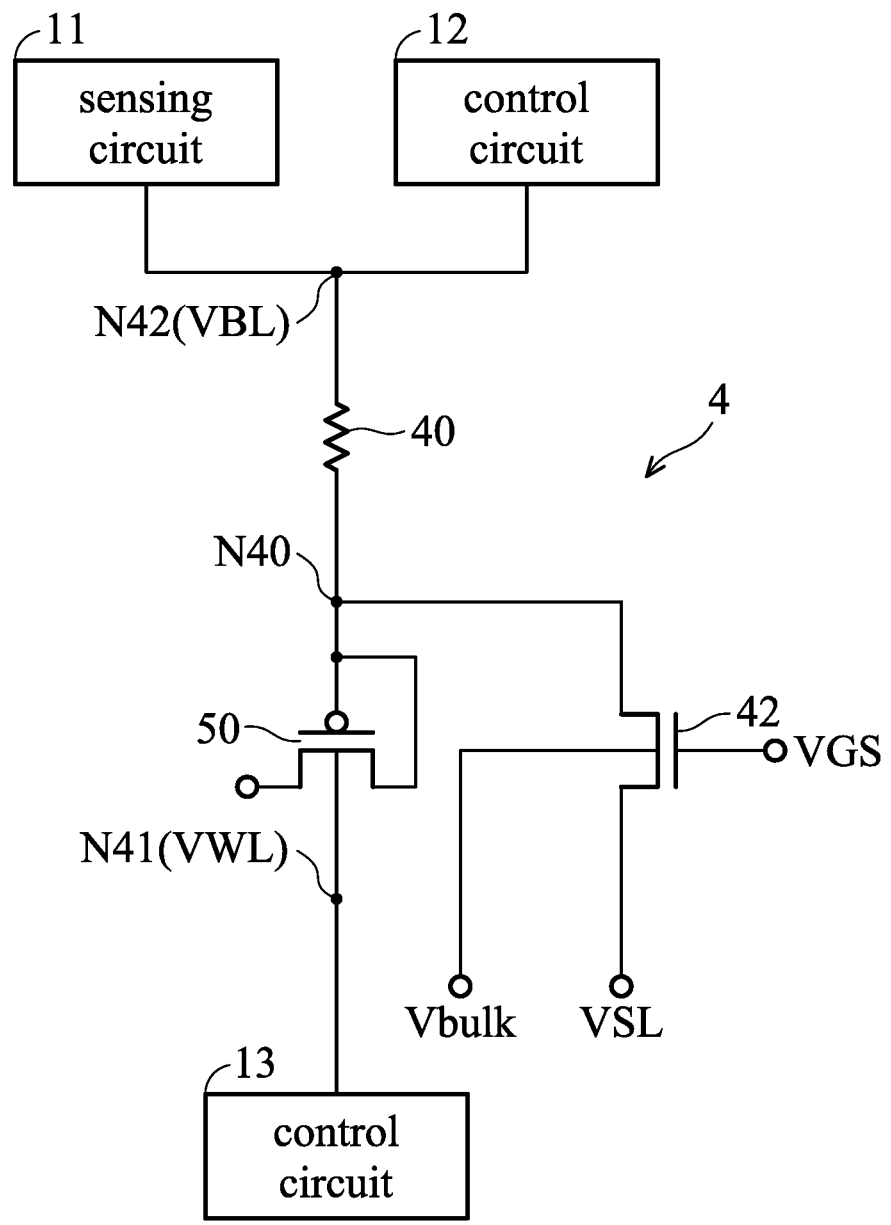
FIG. 5 shows another exemplary embodiment of a resistive memory unit.

FIG. 4 shows another exemplary embodiment of a memory unit. FIG. 4 shows the circuit structure of one memory unit. However, the other memory units of the memory array 1 have the same circuit structure. Moreover, in order to clearly describe the write and read operations performed on the memory units, FIG. 4 also shows the sensing circuit 11 and the control circuits 12 and 13. Referring to FIG. 4 the memory unit 4 comprises a resistive element 40, a diode 41, and an NMOS 42. The resistive element 40 is implemented by a phase-change material. The first terminal of the resistive element 40 is coupled to a node N42, and the second terminal thereof is coupled to a node N40. The anode of the diode 41 is coupled to the node N40, and the cathode thereof is coupled to a node N41. The gate (control electrode) of the NMOS transistor 42 receives a control signal VGS, the drain (first electrode) thereof is coupled to the node N40, and the source (second electrode) thereof receives a selection voltage VSL. The bulk of the NMOS transistor 42 receives a bulk voltage Vbulk. The sensing circuit 11 and the control circuit 12 are coupled to the node N42, while the control circuit 13 is coupled to the node N41. The control circuit 12 provides a bit voltage VBL to the node N42. The control circuit 13 provides a word voltage VWL to the node N41.

When the memory 1 performs a write operation on the memory unit 4, the control circuit 12 provides a voltage at a high enough level according to the operation voltage of the memory 1 to serve as the bit voltage VBL, and the control circuit 13 provides a low-level voltage (such as 0V) to serve as the word voltage VWL. Meanwhile, the bulk voltage Vbulk is at a low level which is equal to or lower than 0V, the selection voltage VSL is at another low level which is equal to or lower than 0V, and the NMOS transistor 42 is turned on according to the control signal VGS. Since the bit voltage VBL with the high enough level is applied to the memory 4, the resistance of the resistive element 40 changes, thereby writing data into the memory unit 4.

When the memory 1 performs a read operation on the memory unit 4, the control circuit 12 provides a voltage, which changes with the operation voltage and whose level is lower than the level of the operation voltage, to serve as the bit voltage VBL, and the control circuit 13 provide a low-level voltage (such as 0V) to serve as the word voltage VWL. Meanwhile, the bulk voltage Vbulk is at a low level which is equal to or lower than 0V, the selection voltage VSL is at another low level which is equal to or lower than 0V, and the NMOS transistor 42 is turned on according to the control signal VGS. In cases where the operation voltage of the memory 1 is relatively high, the bit voltage VBL is at a high level in response to the operation voltage. At this time, based on the element characteristics of the diode 41, the diode 41 is turned on and has a large diode current due to the bit voltage VBL with the high level. Thus, the current flowing through the resistive element 40 is large enough for the sensing circuit 11 to obtain the resistance of the resistive element 40 through sensing the current following the resistive element 40, thereby obtaining the data which had been written into the memory unit 4. In cases where the operation voltage of the memory 1 is relatively low, the bit voltage VBL is at a low level in response to the operation voltage. At this time, even though the diode current of the diode 41 is less, the NMOS transistor 42 has an enough drain-source current due to the element characteristics of the NMOS transistor 42. Thus, at the low operation voltage, there is an enough current flowing through the resistive element 40. The sensing circuit 11 senses the current and obtains the resistance of the resistive element 42 according to the sensed current, thereby obtaining the data which had been written into the memory unit 4.

When no any write or read operation is performed on the memory unit 4, the voltage, which is provided by the control circuit 13 to serve as the word voltage VWL, is at at the same level as the bit voltage VBL present at that time, thereby avoiding a write error which is caused by generation of a current between the nodes N40 and N41.

According to the above embodiment, when the memory 1 operates at a low operation voltage, there is an enough current flowing through the resistive element 40 because the NMOS transistor 42 provides an extra current path, so that the sensing circuit 11 can also correctly read data stored in the memory unit.

In the embodiment, in the write and read operations, the bulk voltage Vbulk, the selection voltage VSL, and the word voltage VWL have the same level (Vbulk=VSL=VWL), or the bulk voltage Vbulk and the selection voltage VSL are equal to each other and also lower than the word voltage VWL (Vbulk=VSL<VWL), or the bulk voltage Vbulk is lower than the selection voltage VSL and the selection voltage VSL is lower than the word voltage VWL (Vbulk<VSL<VWL).

In another embodiment, the diode 41 can be implemented by a PMOS transistor. Referring to FIG. 4, both the gate (control electrode) and the drain (first electrode) of the PMOS transistor 50 are coupled to the node N40, and the source (second electrode) thereof is floating. The bulk of the PMOS transistor 50 is coupled to the node N41.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A memory unit comprising:
   a resistive element having a first terminal receiving a bit voltage and a second terminal coupled to a first node;
   a diode having an anode coupled to the first node and a cathode coupled to a second node, wherein the second node receives a word voltage; and
   a first transistor having a control electrode, a first electrode coupled to the first node, and a second electrode,
   wherein the second electrode of the first transistor is directly connected to the second node or receives a selection voltage,
   when a read operation is performed on the memory unit, the bit voltage is at a first level, the word voltage is at a second level that is lower than the first level, and the first transistor is turned on, and
   wherein a bulk of the first transistor receives a bulk voltage, and the bulk voltage is at the second level or a third level that is lower than the second level.

2. The memory unit as claimed in claim 1, wherein the second electrode of the first transistor receives the selection voltage, and the selection voltage is at the second level or a fourth level that is lower than the second level.

3. The memory unit as claimed in claim 2, wherein the fourth level is higher than or equal to the third level.

4. The memory unit as claimed in claim 1, wherein the diode comprises:
   a second transistor having a control electrode and a first electrode both coupled to the first node, a second electrode being floating, and a bulk coupled to the second node.

5. The memory unit as claimed in claim 4, wherein the first transistor is an N-type transistor, and the second transistor is a P-type transistor.

6. A resistive memory comprising:
   a memory array comprising a plurality of memory units, wherein each of the plurality of memory units comprises:
   a resistive element having a first terminal receiving a bit voltage and a second terminal coupled to a first node;
   a diode having an anode coupled to the first node and a cathode coupled to a second node, wherein the second node receives a word voltage; and
   a first transistor having a control electrode, a first electrode coupled to the first node, and a second electrode, wherein the second electrode of the first transistor is directly connected to the second node or receives a selection voltage; and
   a sensing circuit coupled to the memory array,
   wherein when the resistive memory performs a read operation on a first memory unit among the plurality of memory units, the sensing circuit senses a current flowing through the first memory unit to obtain data stored in the first memory unit,
   wherein when the resistive memory performs the read operation on the first memory unit, the word voltage is lower than the bit voltage, and
   wherein for each of the plurality of memory units, a bulk of the first transistor receives a bulk voltage, and the bulk voltage is equal to or lower than the word voltage.

7. The resistive memory as claimed in claim 6, further comprising:
   a first control circuit coupled to the plurality of memory units; and
   a second control circuit coupled to the plurality of memory units,
   wherein when the resistive memory performs the read operation on the first memory unit, the first control circuit provides the bit voltage of the first memory unit, and the second control circuit provides the word voltage of the first memory unit.

8. The resistive memory as claimed in claim 7, wherein for each of the plurality of memory units, the second electrode of the first transistor receives the selection voltage, and the selection voltage is equal to or lower than the word voltage.

9. The resistive memory as claimed in claim 8, wherein the selection voltage is equal to or higher than the bulk voltage.

10. The resistive memory as claimed in claim 6, wherein when the resistive memory performs a write operation on the first memory unit, the first control circuit provides a third voltage to serve as the bit voltage of the first memory unit to write data into the first memory unit.

11. The resistive memory as claimed in claim 6, wherein for each of the plurality of memory units, the diode comprises:
   a second transistor having a control electrode and a first electrode both coupled to the first node, a second electrode that is floating, and a bulk coupled to the second node.

12. The resistive memory as claimed in claim 11, for each of the plurality of memory units, the first transistor is an N-type transistor, and the second transistor is a P-type transistor.

* * * * *